(12) United States Patent
Ilchenko et al.

(10) Patent No.: US 8,442,088 B1
(45) Date of Patent: May 14, 2013

(54) DIFFRACTIVE GRATING COUPLED WHISPERING GALLERY MODE RESONATORS

(75) Inventors: Vladimir Ilchenko, Arcadia, CA (US); Anatoliy Savchenkov, Glendale, CA (US); Lutfollah Maleki, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 0 days.

(21) Appl. No.: 13/089,181

(22) Filed: Apr. 18, 2011

Related U.S. Application Data

(62) Division of application No. 12/157,916, filed on Jun. 13, 2008, now Pat. No. 7,929,589.

(60) Provisional application No. 60/934,799, filed on Jun. 13, 2007.

(51) Int. Cl.
*H01S 3/06* (2006.01)
*G02B 6/26* (2006.01)
*G02B 6/42* (2006.01)

(52) U.S. Cl.
USPC ............... 372/67; 372/66; 372/102; 385/39

(58) Field of Classification Search ............ 372/66, 372/67, 102; 385/39
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Itchenko et al. | |
| 6,490,039 B2 | 12/2002 | Maleki et al. | |
| 6,535,328 B2 | 3/2003 | Yao | |

(Continued)

FOREIGN PATENT DOCUMENTS

WO 01/96936 A1 12/2001
WO WO 2005008296 A2 * 1/2005

(Continued)

OTHER PUBLICATIONS

Braginsky, V.B., et al., "Quality-Factor and Nonlinear Properties of Optical Whispering-Gallery Modes," Physics Letters A, 137(7, 8):393-397, May 1989.

(Continued)

*Primary Examiner* — Jessica Stultz
*Assistant Examiner* — Joshua King
(74) *Attorney, Agent, or Firm* — Perkins Coie LLP

(57) ABSTRACT

Optical resonators and optical devices based on optical resonators that implement diffractive couplers for coupling light with the optical resonators.

17 Claims, 8 Drawing Sheets

U.S. PATENT DOCUMENTS

| | | | |
|---|---|---|---|
| 6,567,436 B1 | 5/2003 | Yao et al. | |
| 6,580,532 B1 | 6/2003 | Yao et al. | |
| 6,594,061 B2 | 7/2003 | Huang et al. | |
| 6,762,869 B2 | 7/2004 | Maleki et al. | |
| 6,795,481 B2 | 9/2004 | Maleki et al. | |
| 6,798,947 B2 | 9/2004 | Iltchenko | |
| 6,853,479 B1 | 2/2005 | Ilchenko et al. | |
| 6,871,025 B2 | 3/2005 | Maleki et al. | |
| 6,873,631 B2 | 3/2005 | Yao et al. | |
| 6,879,752 B1 | 4/2005 | Ilchenko et al. | |
| 6,901,189 B1 | 5/2005 | Savchenkov et al. | |
| 6,906,309 B2 | 6/2005 | Sayyah et al. | |
| 6,922,497 B1 | 7/2005 | Savchenkov et al. | |
| 6,928,091 B1 | 8/2005 | Maleki et al. | |
| 6,943,934 B1 | 9/2005 | Ilchenko et al. | |
| 6,987,914 B2 | 1/2006 | Savchenkov et al. | |
| 7,024,069 B2 | 4/2006 | Savchenkov et al. | |
| 7,043,117 B2 | 5/2006 | Matsko et al. | |
| 7,050,212 B2 | 5/2006 | Matsko et al. | |
| 7,061,335 B2 | 6/2006 | Maleki et al. | |
| 7,062,131 B2 | 6/2006 | Ilchenko | |
| 7,092,591 B2 | 8/2006 | Savchenkov et al. | |
| 7,133,180 B2 | 11/2006 | Ilchenko et al. | |
| 7,173,749 B2 | 2/2007 | Maleki et al. | |
| 7,184,451 B2 | 2/2007 | Ilchenko et al. | |
| 7,187,870 B2 | 3/2007 | Ilchenko et al. | |
| 7,218,662 B1 | 5/2007 | Ilchenko et al. | |
| 7,245,432 B2 * | 7/2007 | Shahar | 359/576 |
| 7,248,763 B1 | 7/2007 | Kossakovski et al. | |
| 7,260,279 B2 | 8/2007 | Gunn et al. | |
| 7,283,707 B1 * | 10/2007 | Maleki et al. | 385/39 |
| 7,356,214 B2 | 4/2008 | Ilchenko | |
| 7,362,927 B1 | 4/2008 | Ilchenko et al. | |
| 7,369,722 B2 | 5/2008 | Yilmaz et al. | |
| 7,389,053 B1 | 6/2008 | Ilchenko et al. | |
| 7,400,796 B1 | 7/2008 | Kossakovski et al. | |
| 7,440,651 B1 | 10/2008 | Savchenkov et al. | |
| 7,460,746 B2 | 12/2008 | Maleki et al. | |
| 7,480,425 B2 | 1/2009 | Gunn et al. | |
| 7,587,144 B2 | 9/2009 | Ilchenko et al. | |
| 7,929,589 B1 * | 4/2011 | Ilchenko et al. | 372/67 |
| 2001/0038651 A1 | 11/2001 | Maleki et al. | |
| 2002/0018611 A1 | 2/2002 | Maleki et al. | |
| 2002/0018617 A1 | 2/2002 | Iltchenko et al. | |
| 2002/0021765 A1 | 2/2002 | Maleki et al. | |
| 2002/0081055 A1 | 6/2002 | Painter et al. | |
| 2002/0085266 A1 | 7/2002 | Yao | |
| 2002/0097401 A1 | 7/2002 | Maleki et al. | |
| 2003/0160148 A1 | 8/2003 | Yao et al. | |
| 2004/0100675 A1 | 5/2004 | Matsko et al. | |
| 2004/0109217 A1 | 6/2004 | Maleki et al. | |
| 2004/0218880 A1 | 11/2004 | Matsko et al. | |
| 2004/0240781 A1 | 12/2004 | Savchenkov et al. | |
| 2005/0017816 A1 | 1/2005 | Ilchenko et al. | |
| 2005/0063034 A1 | 3/2005 | Maleki et al. | |
| 2005/0074200 A1 | 4/2005 | Savchenkov et al. | |
| 2005/0123306 A1 | 6/2005 | Ilchenko et al. | |
| 2005/0128566 A1 | 6/2005 | Savchenkov et al. | |
| 2005/0147355 A1 | 7/2005 | Ilchenko | |
| 2005/0175358 A1 | 8/2005 | Ilchenko et al. | |
| 2005/0248823 A1 | 11/2005 | Maleki et al. | |
| 2006/0051018 A1 * | 3/2006 | Martinez | 385/31 |
| 2007/0009205 A1 | 1/2007 | Maleki et al. | |
| 2007/0153289 A1 | 7/2007 | Yilmaz et al. | |
| 2008/0001062 A1 | 1/2008 | Gunn et al. | |
| 2008/0075464 A1 | 3/2008 | Maleki et al. | |
| 2008/0304787 A1 * | 12/2008 | Kittaka et al. | 385/12 |
| 2008/0310463 A1 | 12/2008 | Maleki et al. | |
| 2009/0097516 A1 | 4/2009 | Maleki et al. | |
| 2009/0135860 A1 | 5/2009 | Maleki et al. | |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Eliyahu, D., et al., "Low Phase Noise and Spurious Levels in Multi-Loop Opto-Electronic Oscillators," Proceedings of the 2003 IEEE International Frequency Control Sympsoium and PDA Exhibition, pp. 405-410, May 2003.

Eliyahu, D., et al., "Modulation Response (S21) of the Coupled Opto-Electronic Oscillator," Proceedings of the 2005 IEEE International Frequency Control Symposium and Exposition, pp. 850-856, Aug. 2005.

Eliyahu, D., et al., "Tunable, Ultra-Low Phase Noise YIG Based Opto-Electronic Oscillator," IEEE MTT-S International Microwave Symposium Digest, 3:2185-2187, Jun. 2003.

Gorodetsky, M.L., et al., "Optical Microsphere Resonators: Optimal Coupling to High-Q Whispering-Gallery Modes," J. Opt. Soc. Am. B, 16(1):147-154, Jan. 1999.

Gorodetsky, M.L., et al., "Rayleigh Scattering in High-Q Microspheres," J. Opt. Soc. Am. B, 17(6):1051-1057, Jun. 2000.

Gorodetsky, M.L., et al., "Ultimate Q of Optical Microsphere Resonators," Optics Letters, 21(7):453-455, Apr. 1996.

Hryniewicz, J.V., et al., "Higher Order Filter Response in Coupled Microring Resonators," IEEE Photonics Technology Letters, 12(3):320-322, Mar. 2000.

Huang, S., et al., "A 'Turnkey' Optoelectronic Oscillator with Low Acceleration Sensitivity," 2000 IEEE/EIA International Frequency Control Symposium and Exhibition, pp. 269-279, Jun. 2000.

Ilchenko V. et al., "Electrooptically Tunable Photonic Microresonators and Photonic Bandgap Waveguide Coupling for Micro-Optoelectronic Oscillators," GOMACTech 2003, Tampa, Florida, pp. 1-4.

Ilchenko, V., et al., "High-Q Microsphere Cavity for Laser Stabilization and Optoelectronic Microwave Oscillator," Proceedings SPIE Microresonators and Whispering-Gallery Modes, vol. 3611, pp. 190-198, Jan. 1999.

Ilchenko, V., et al., "Microsphere Integration in Active and Passive Photonics Devices," Proc. of SPIE Laser Resonators III, vol. 3930, pp. 154-162, Jan. 2000.

Ilchenko, V., et al., "Microtorus: A High-Finesse Microcavity with Whispering-Gallery Modes," Optics Letters, 26 (5):256-258, Mar. 2001.

Ilchenko, V., et al., "Pigtailing the High-Q Microsphere Cavity: A Simple Fiber Coupler for Optical Whispering-Gallery Modes," Optics Letters, 24(11):723-725, Jun. 1999.

Ilchenko, V., et al., "Tunability and Synthetic Lineshapes in High-Q Optical Whispering Gallery Modes," Proc. of SPIE Laser Resonators and Beam Control VI, vol. 4969, pp. 195-206, Jan. 2003.

Ilchenko, V., et al., "Whispering-Gallery-Mode Electro-Optic Modulator and Photonic Microwave Receiver," J. Opt. Soc. Am. B, 20(2):333-342, Feb. 2003.

Ilchenko, V., et al., "Sub-Micro Watt Photonic Microwave Receiver," IEEE Photonics Technology Letters, 14(11):1602-1604, Nov. 2002.

Ito, H., et al., "InP/InGaAs Uni-Travelling-Carrier Photodiode with 310 GHz Bandwidth," Electronics Letters, 36(21):1809-1810, Oct. 2000.

Logan, R., et al., "Stabilization of Oscillator Phase Using a Fiber-Optic Delay-Line," IEEE 45th Annual Symposium on Frequency Control, pp. 508-512, May 1991.

Maleki, L., "The Opto-Electronic Oscillator: Prospects for Extending the State of the Art in Reference Frequency Generation," International Topical Meeting on Microwave Photonics, pp. 195-198, Oct. 1998.

Matsko, A., et al., "Active Mode Locking with Whispering-Gallery Modes," J. Opt. Soc. Am. B, 20(11):2292-2296, Nov. 2003.

Matsko, A., et al., "Whispering-Gallery-Mode based Optoelectronic Microwave Oscillator," Journal of Modern Optics, 50(15-17):2523-2542, Feb. 2004.

Matsko, A., et al., "Whispering-Gallery-Mode Resonators as Frequency References. I. Fundamental Limitations," J. Opt. Soc. Am. B, 24(6):1324-1335, Jun. 2007.

Myers, L.E., et al., "Quasi-Phase-Matched Optical Parametric Oscillators in Bulk Periodically Poled LiNbO3," J. Opt. Soc. Am. B, 12(11):2102-2116, Nov. 1995.

Savchenkov, A., et al., "Whispering-Gallery-Mode Resonators as Frequency References. II. Stabilization," J. Opt. Soc. Am. B, 24(12):2988-2997, Dec. 2007.

Vassiliev, V.V., et al., "Narrow-Line-Width Diode Laser with a High-Q Microsphere Resonator," Optics Communications, 158(1-6):305-312, Dec. 1998.

Yao, X.S., et al., "A Novel Photonic Oscillator," Digest of the LEOS Summer Topical Meetings, pp. 17-18, Aug. 1995.

Yao, X.S., et al., "A Novel Photonic Oscillator," TDA Progress Report 42-122, pp. 32-43, Aug. 1995.

Yao, X.S., et al., "Converting Light into Spectrally Pure Microwave Oscillation," Optics Letters, 21(7):483-485, Apr. 1996.

Yao, X.S., et al., "Coupled Optoelectronic Oscillators for Generating Both RF Signal and Optical Pulses," Journal of Lightwave Tecnhology, 18(1):73-78, Jan. 2000.

Yao, X.S., et al., "Dual Microwave and Optical Oscillator," Optics Letters, 22(24):1867-1869, Dec. 1997.

Yao, X.S., et al., "Multiloop Optoelectronic Oscillator," IEEE Journal of Quantum Electronics, 36(1):79-84, Jan. 2000.

Yao, X.S., et al., "Optoelectronic Microwave Oscillator," J. Opt. Soc. Am. B, 13(8):1725-1735, Aug. 1996.

Yao, X.S., et al., "Optoelectronic Oscillator for Photonic Systems," IEEE Journal of Quantum Electronics, 32(7):1141-1149, Jul. 1996.

Yu, J., et al., "Compact Optoelectronic Oscillator with Ultra-Low Phase Noise Performance," Electronics Letters, 35(18):1554-1555, Sep. 1999.

* cited by examiner

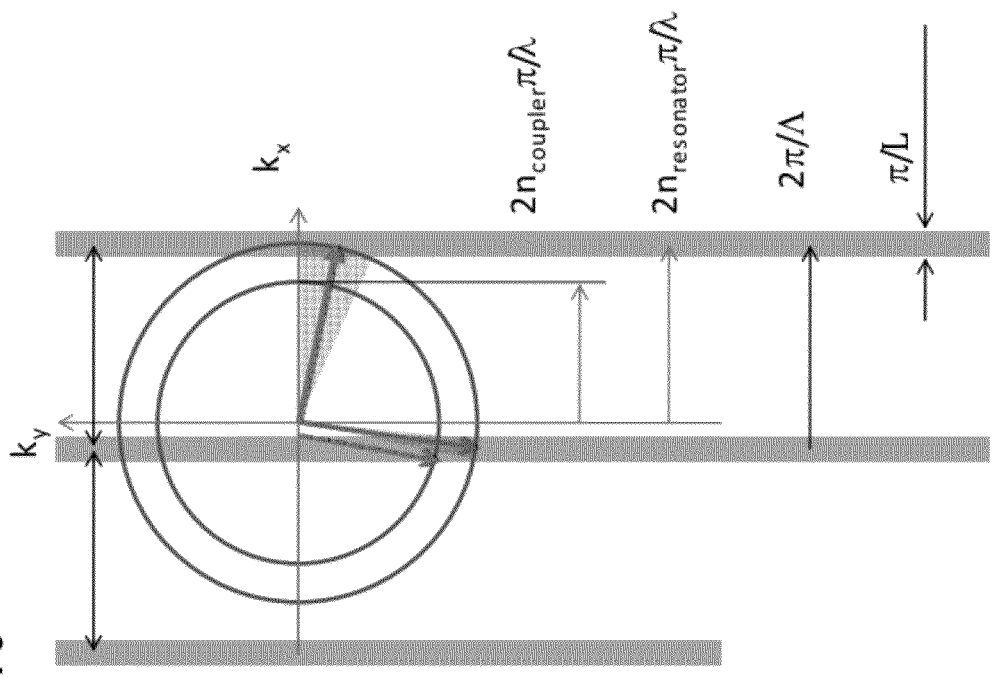
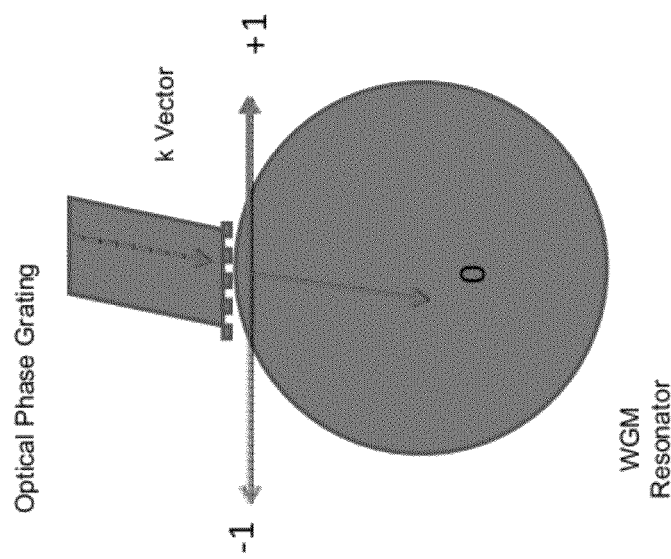
FIG. 6

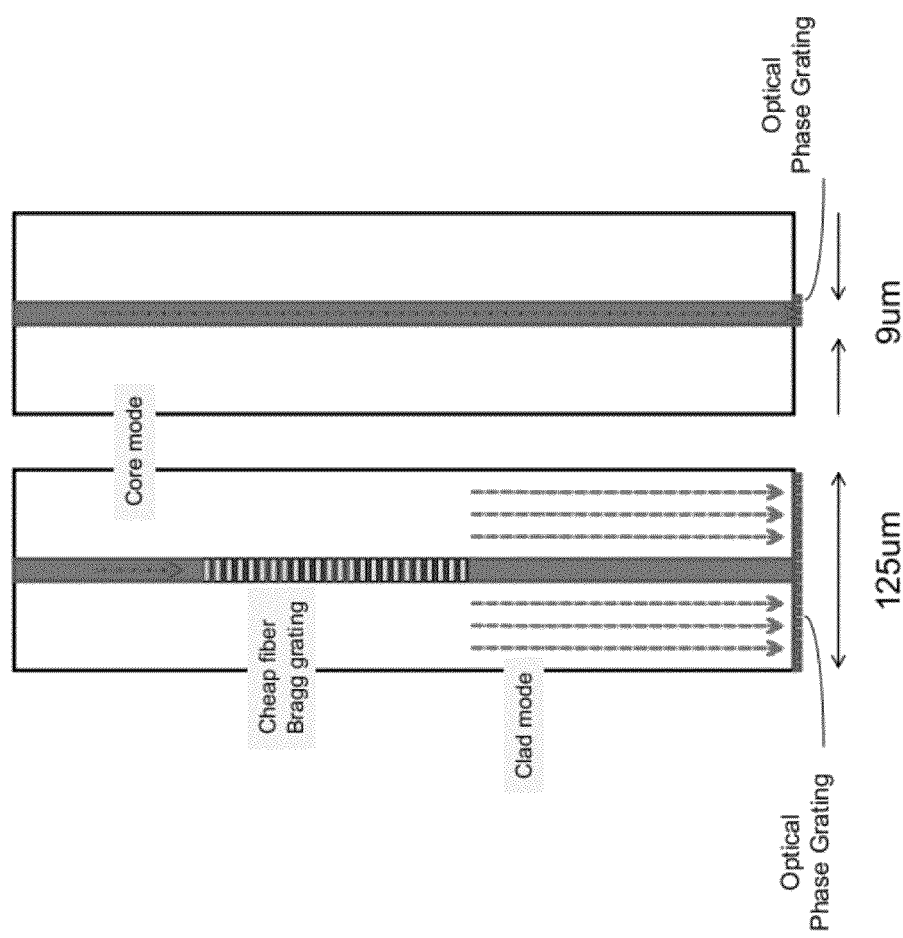

DIFFRACTIVE GRATING COUPLED WHISPERING GALLERY MODE RESONATORS

PRIORITY CLAIMS AND RELATED APPLICATIONS

This application is a divisional (and claims the benefit of priority under 35 USC 121) of U.S. patent application Ser. No. 12/157,916 entitled "Diffractive Grating Coupled Whispering Gallery Mode Resonators" filed Jun. 13, 2008, which claims priority to U.S. Provisional Application No. 60/934,799 entitled "Diffractive Coupler for High-Q Whispering-Gallery Microresonators" and filed Jun. 13, 2007. The disclosures of the prior applications are considered part of (and are incorporated by reference in) the disclosure of this application.

BACKGROUND

This application relates to optical resonators and optical devices based on optical resonators.

Optical resonators may be used to spatially confine resonant optical energy in a limited cavity with a low optical loss. The resonance of an optical resonator may be used to provide various useful functions such as optical filtering, optical modulation, optical amplification, optical delay, and others. Light can be coupled into or out of optical resonators via various coupling mechanisms according to the configurations of the resonators. For example, Fabry-Perot optical resonators with two reflectors at two terminals may use partial optical transmission of at least one reflector to receive or export light.

Optical whispering gallery mode (WGM) resonators confine light in a whispering gallery mode that is totally reflected within a closed circular optical path. Unlike Fabry-Perot resonators, light in WGM resonators cannot exit the resonators by optical transmission. Light in a WGM resonator "leaks" out of the exterior surface of the closed circular optical path of a WGM resonator via the evanescence field of the WG mode. An optical coupler can be used to couple light into or out of the WGM resonator via this evanescent field.

SUMMARY

The specification of this application describes, among others, examples and implementations of diffractive grating couplers for WGM resonators.

In one example, an optical device, includes: an optical resonator structured to support a whispering gallery mode circulating in a plane of the optical resonator; and a diffractive grating coupler comprising a substrate and a phase-type diffractive grating formed in the substrate, the diffractive grating coupler being located close to the optical resonator to evanescently couple an input optical beam incident at a normal incidence to one side of the substrate of the diffractive grating into the optical resonator located on the other side of the substrate of the diffractive grating. The diffractive grating is structured to suppress diffracted light along the normal incidence and diffract light of the input optical beam into a first diffraction order at a first side of the normal incidence that matches in phase with light in the whispering gallery mode along a first circulating direction and a second diffraction order at a second side of the normal incidence that matches in phase with light in the whispering gallery mode along a second circulating direction opposite to the first circulating direction to create a standing wave in the whispering gallery mode inside the optical resonator.

In another example, an optical device includes an optical resonator structured to support a whispering gallery mode circulating in a plane of the optical resonator; and a diffractive grating coupler located adjacent to and optically coupled to the optical resonator. This diffractive grating coupler includes a fiber comprising a fiber core and a fiber cladding surrounding the fiber core, wherein the fiber core comprises a fiber grating section configured to diffract guided light in the fiber core into the fiber cladding toward the an end facet of the fiber, and wherein the fiber is located to place the end facet adjacent to a surface of the optical resonator to provide optical coupling with the optical resonator; and a phase-type diffractive grating formed on the end facet to evanescently couple light between the fiber and the optical resonator, wherein the diffractive grating is structured to suppress diffracted light in a zero diffraction order and diffract light of the input optical beam into light in at least one of two first diffraction orders that matches in phase with the whispering gallery mode inside the optical resonator.

These and other examples and implementations are described in detail in the drawings, the detailed description, and the claims.

BRIEF DESCRIPTION OF THE DRAWINGS

FIGS. 4, 5 and 6 show examples of different operations of fiber grating couplers for WGM resonators.

FIGS. 7 and 8 show two different fiber grating couplers for WGM resonators.

DETAILED DESCRIPTION

The grating couplers described in this application can be used in various configurations. In one configuration, for example, such grating couplers can be used to implement a normal-incidence coupling method for microresonators. Normally incident beam, or propagating mode of a waveguide is shaped to match the evanescent field envelope during contact of coupler with a spheroidal microresonator by means of, for example, a GRIN lens, or a mode expander in waveguide structure. A phase-type diffractive grating is fabricated at the interface surface of the normal-incidence coupler. This grating couples the incident beam simultaneously to clockwise and counter-clockwise traveling WG modes in the microresonator (upon normal incidence), minus first and plus first diffractive orders. Hence, the incident beam effectively excites a standing WG mode. With angled excitation, the optimal phase grating can excite exclusively minus first order of diffraction and therefore be capable of coupling into uni-directional (traveling wave) whispering-gallery mode.

Under the normal incidence configuration for generating a standing-wave excitation in the resonator, the coupling is optically reciprocal and therefore the resonator provides optical feedback into the coupler. As such, the optical feedback can be used to inject into a laser. This feedback, which is resonant at the frequency of WG mode, can be used for injection locking the low-Q laser such as semiconductor diode Fabry-Perot (FP), or distributed feedback (DFB) laser to suppress frequency fluctuations and narrow the laser linewidth.

Figure 1:
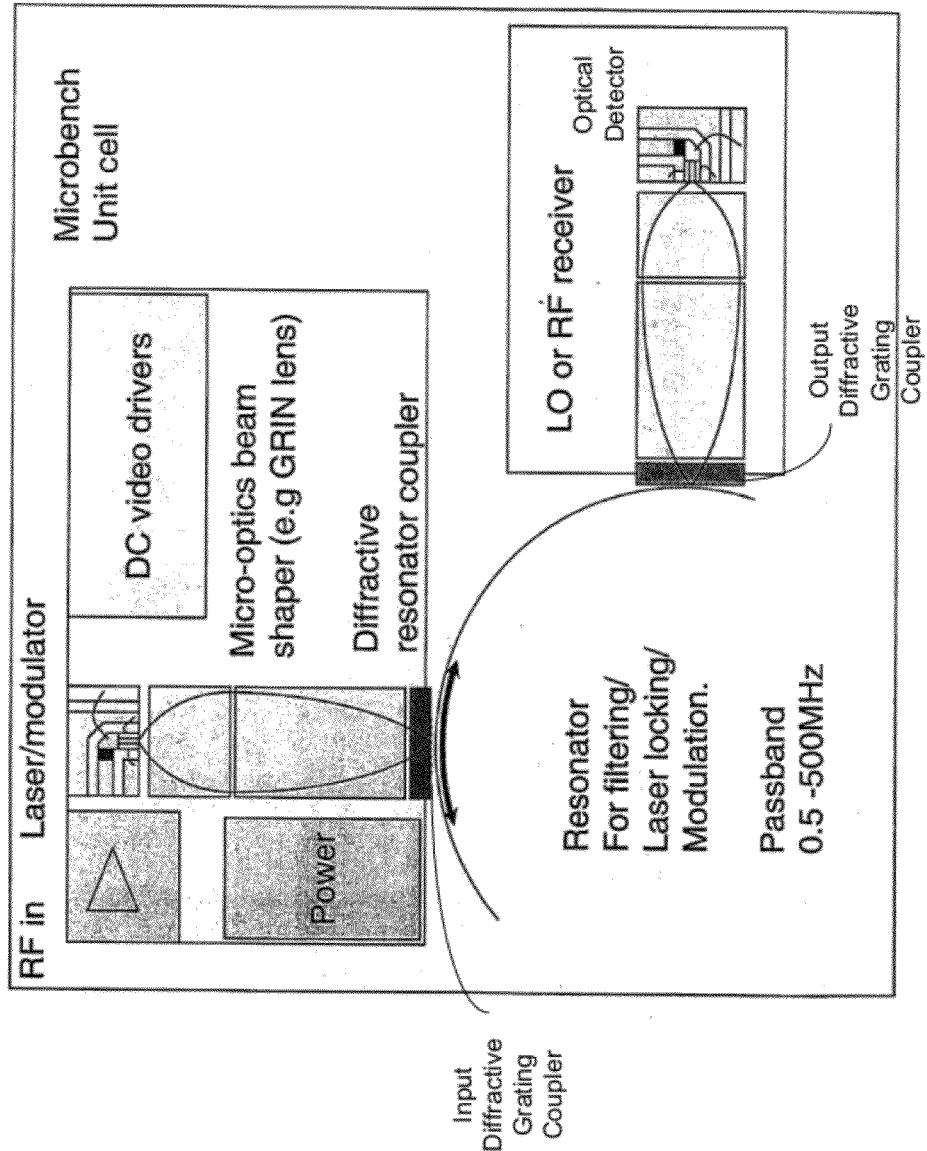
FIG. 1 shows an example of an optical device where a WGM resonator is coupled to two diffractive phase grating couplers in the normal incidence configuration to provide optical input and output.

FIG. 1 shows an example of an optical device where a WGM resonator is coupled to two diffractive phase grating couplers in the normal incidence configuration to provide optical input and output. This device includes an optical resonator structured to support a whispering gallery mode circulating in a plane of the optical resonator and a first diffractive grating coupler that sis coupled to the optical resonator to send light into the optical resonator as an input port on the top of the resonator. A second diffractive phase grating coupler is provided at a different location to couple light out of the optical resonator as an optical output port. The optical output of this output port may be directed into an optical detector as shown or other device. Each grating coupler is paired with a lens assembly for shaping the light to or from the grating coupler. Such a lens assembly can include multiple lens elements such as two different GRIN lens segments with different numerical apertures.

In one implementation, such a diffractive grating coupler can include a substrate and a phase-type diffractive grating formed in the substrate. The diffractive grating coupler is located close to the optical resonator to evanescently couple an input optical beam incident at a normal incidence to one side of the substrate of the diffractive grating into the optical resonator located on the other side of the substrate of the diffractive grating. The diffractive grating is structured to suppress diffracted light along the normal incidence and diffract light of the input optical beam into a first diffraction order at a first side of the normal incidence that matches in phase with light in the whispering gallery mode along a first circulating direction and a second diffraction order at a second side of the normal incidence that matches in phase with light in the whispering gallery mode along a second circulating direction opposite to the first circulating direction to create a standing wave in the whispering gallery mode inside the optical resonator.

In FIG. 1, a laser can be located near the lens assembly as the optical beam shaping device to direct a laser beam as the optical input beam into the optical beam shaping device and to receive feedback light from the optical beam shaping device and the diffractive grating coupler that is received by the diffractive grating via evanescent light of light in the whispering gallery mode at the surface of the optical resonator. Under this configuration, the laser is locked to an optical frequency of the received feedback light due to optical injection locking.

Figure 2:
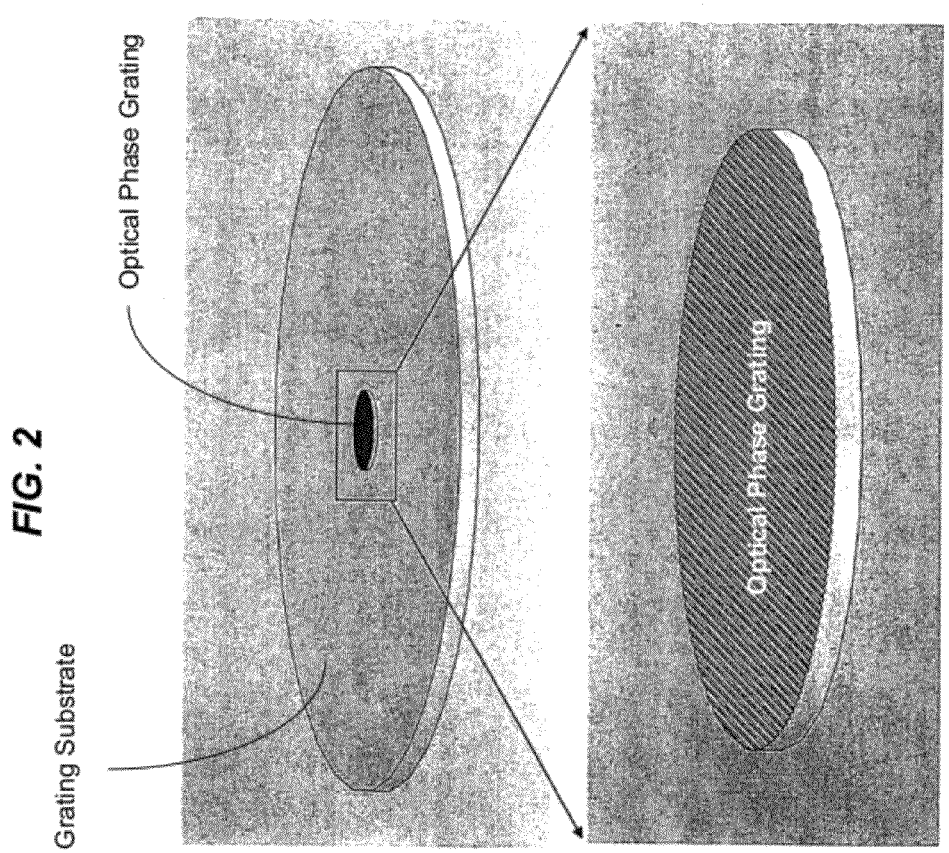
FIG. 2 shows an example of a diffractive grating coupler for use in FIG. 1.

FIG. 2 shows an example of a diffractive grating coupler for use in FIG. 1. A grating substrate is provided to support an optical phase grating on the substrate. The grating substrate can be an end facet of a fiber or a surface of other optical devices.

An optical fiber can be configured to include a fiber grating as a grating coupler for WGM resonators to provide grating assisted coupling.

Figure 3:
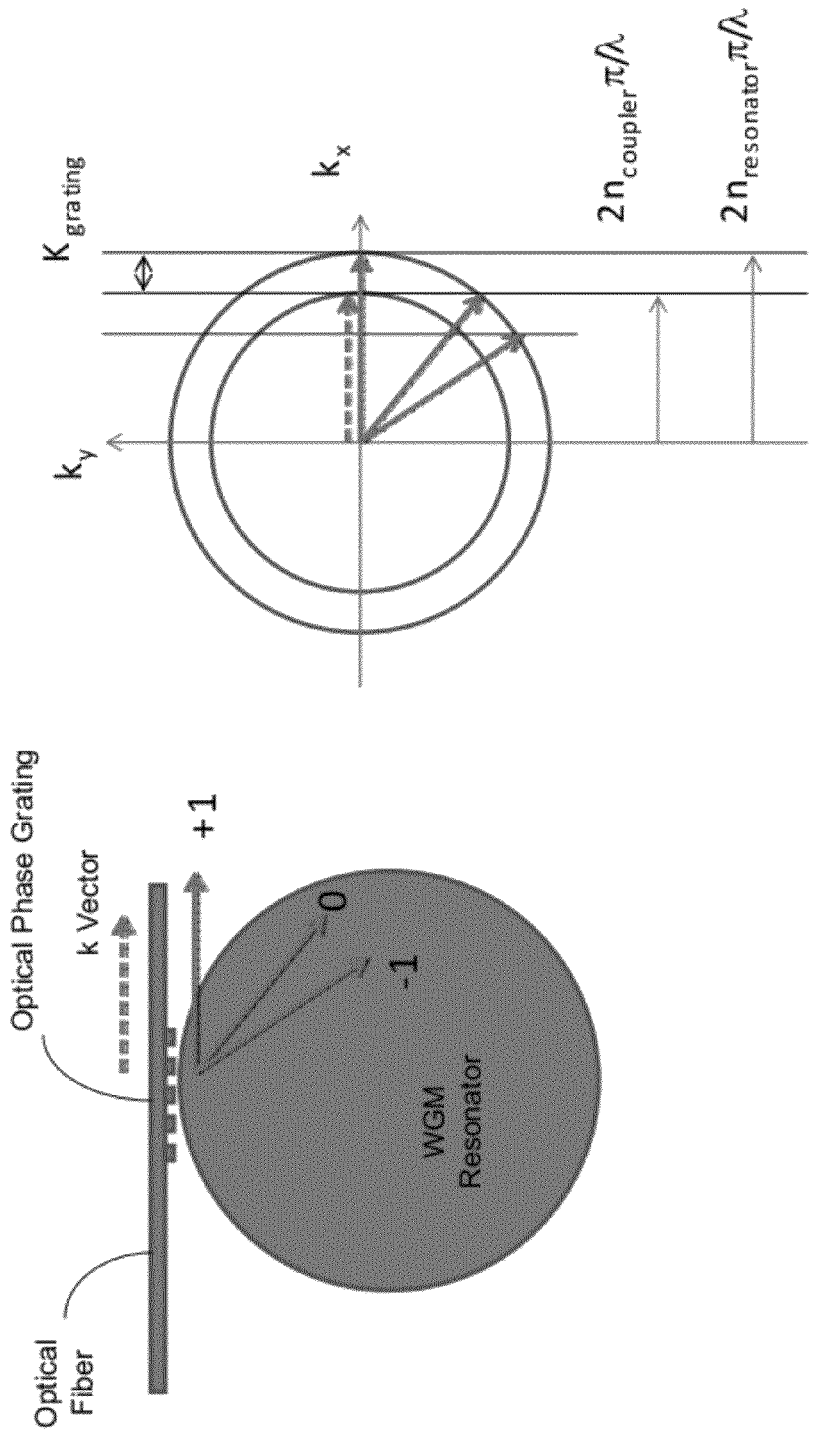
FIG. 3 shows one example of operation of a fiber grating coupler for a WGM resonator.

FIG. 3 shows one example of operation of a fiber grating coupler for a WGM resonator where the wave vector space diagram is also shown. Such a fiber grating is usually used to do phase matching between modes of the coupler and the WGM resonator. In multimode cavities grating couples mode of the coupler (dashed line on left diagram) into many modes of the resonator (three solid red lines). Evanescent field of deeper modes in whispering gallery resonators weakly depend on mode depth. This results in low coupling into +1 diffraction order mode. The zero diffraction order can be suppressed by using of very efficient grating, but side orders tend to have equal efficiencies.

Figure 4:
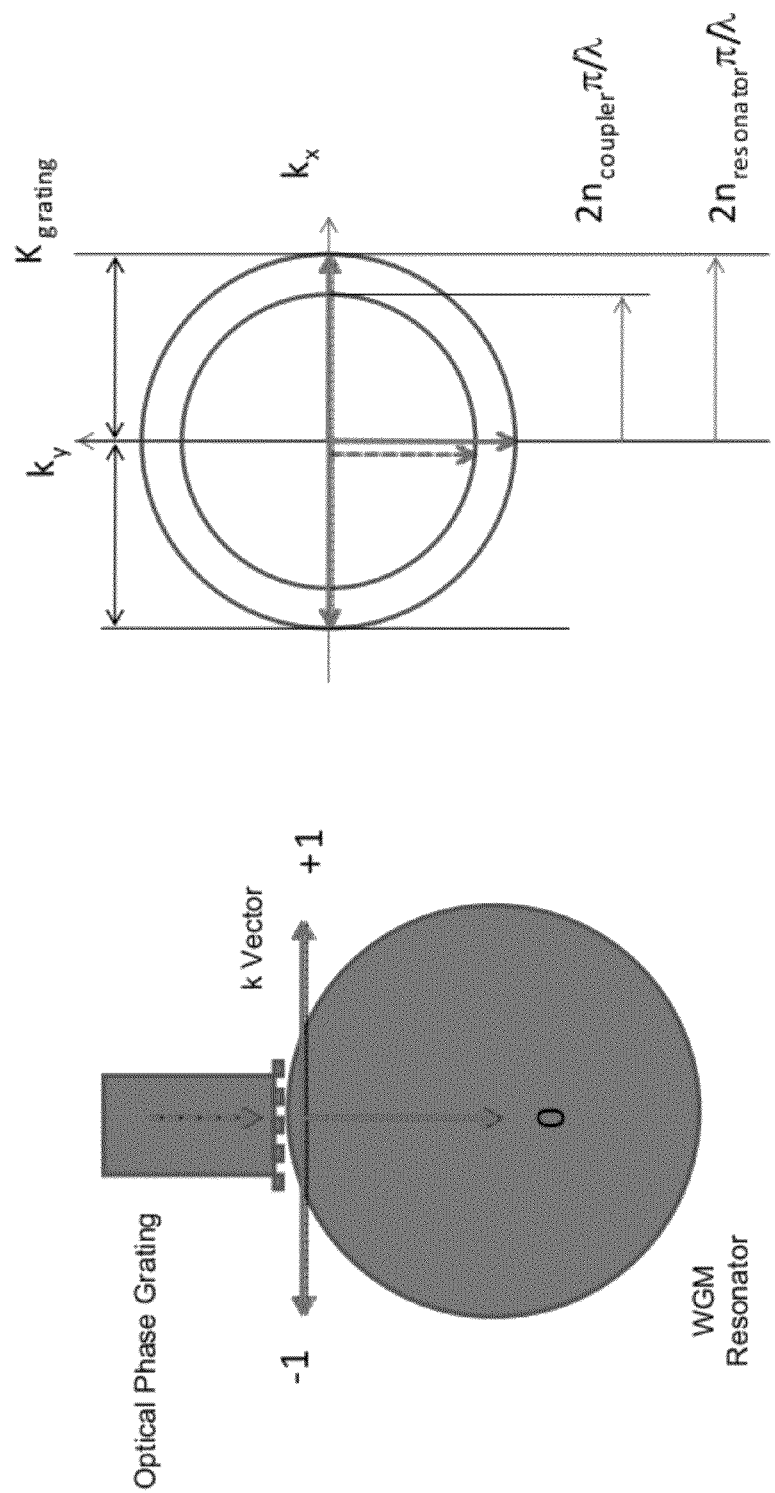
Figure 5:
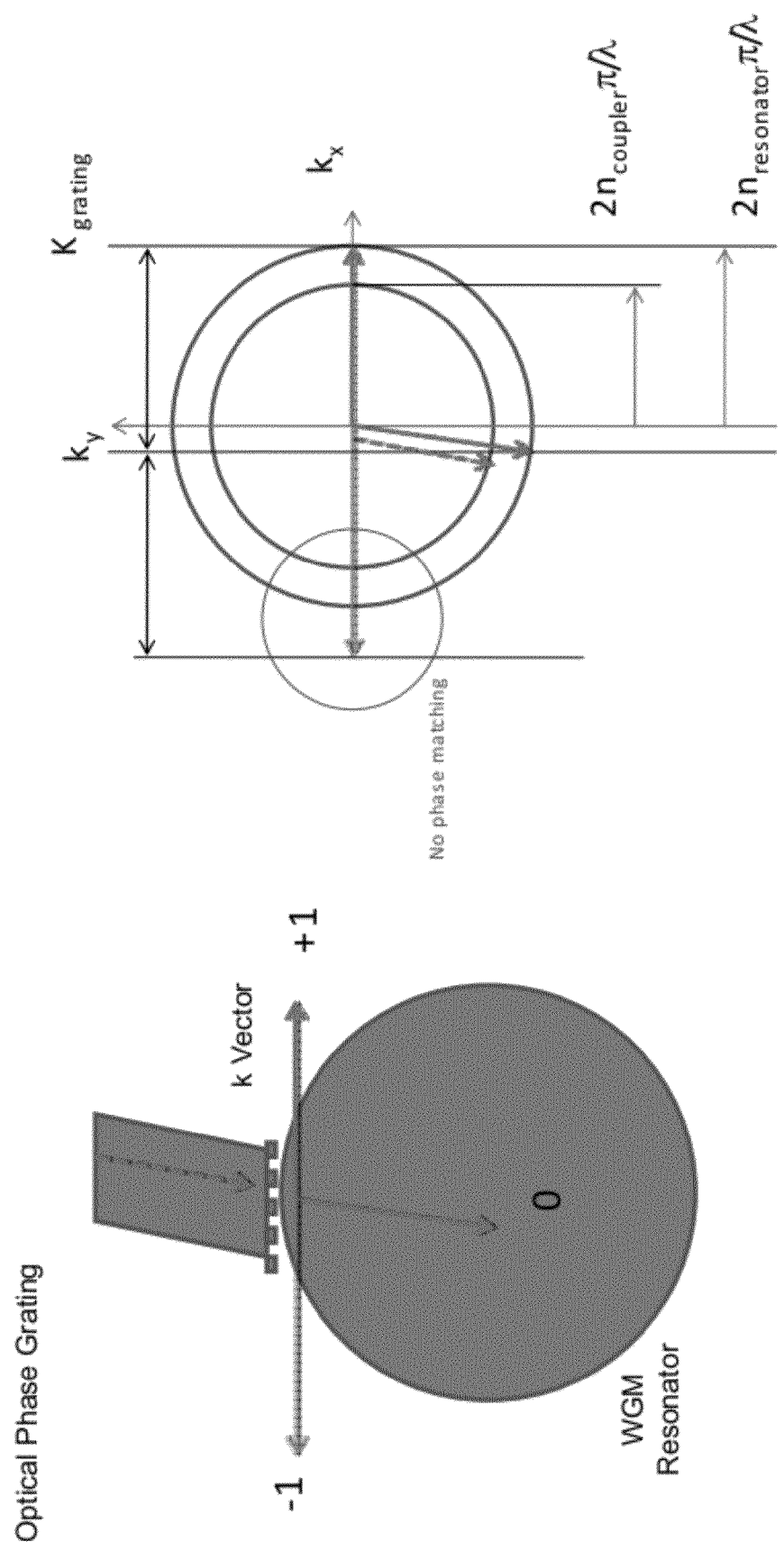

FIGS. 4, 5 and 6 show examples of different operations of fiber grating couplers for WGM resonators.

FIG. 4 shows grating assisted coupling for a standing wave coupling into the WGM resonator. A short period phase grating with large Kgrating value can be used to achieve this operation where the Zero order is suppressed and the plus and minus first diffraction orders correspond to exactly the same whispering gallery mode.

FIG. 5 shows grating assisted coupling for a traveling wave coupling into the WGM resonator. This example uses even shorter period phase grating with large Kgrating value. The zero order is suppressed and the minus first diffraction order is suppressed since phase matching conditions for this kind of mode are not satisfied. Coupling is efficient only to one traveling mode.

FIG. 6 shows the bandwidth of grating assisted coupling bandwidth of the coupling. Grating with unlimited length couples only one mode to only one mode. A phase grating with period Λ and limited length L couples many modes to many modes. In order to increase selectivity of the coupler the length of the grating is be increased.

FIG. 7 shows a fiber diffractive grating coupler that can be located adjacent to and optically coupled to an optical WGM resonator. This diffractive grating coupler includes a fiber that includes a fiber core and a fiber cladding surrounding the fiber core. The fiber core includes a fiber grating section configured to diffract guided light in the fiber core into the fiber cladding toward the an end facet of the fiber, and the fiber is located to place the end facet adjacent to a surface of the optical resonator to provide optical coupling with the optical resonator. A phase-type diffractive grating is formed on the end facet to evanescently couple light between the fiber and the optical resonator. The diffractive grating is structured to suppress diffracted light in a zero diffraction order and diffract light of the input optical beam into light in at least one of two first diffraction orders that matches in phase with the whispering gallery mode inside the optical resonator.

In one configuration, the fiber is oriented to be perpendicular to the surface of the optical resonator to diffract input light into the two first diffraction orders that match in phase with two light waves in the whispering gallery mode inside the optical resonator that propagate in opposite directions to form a standing wave inside the optical resonator.

In another configuration, the fiber is oriented to form an angle with respect to a normal direction of the surface of the optical resonator to diffract input light into only one first diffraction order that matches in phase with the whispering gallery mode inside the optical resonator to generate a unidirectional traveling wave inside the optical resonator.

Figure 9:
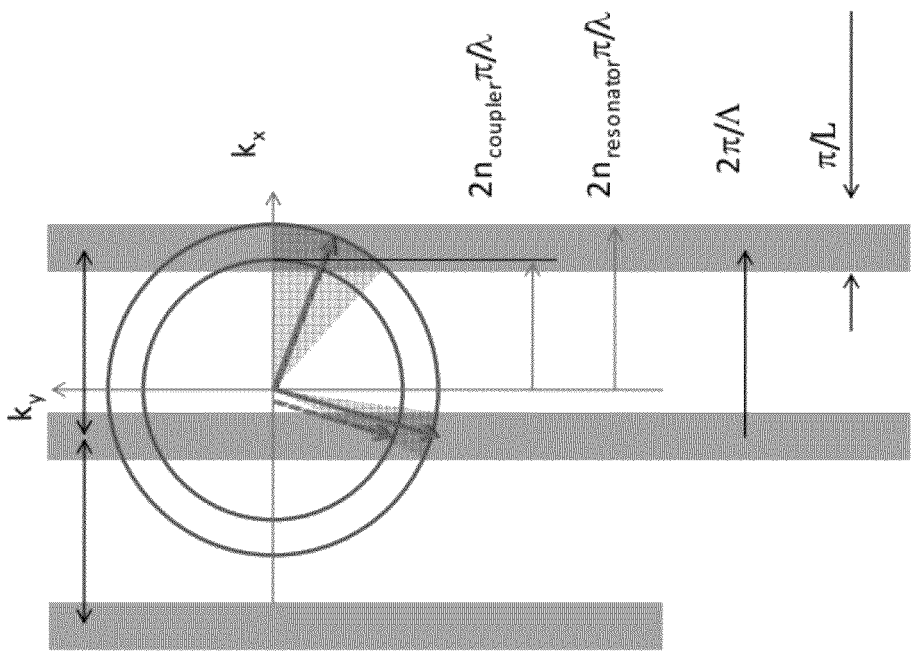
FIGS. 9 and 10 show operations of the two fiber grating couplers in FIGS. 7 and 8, respectively.
Figure 10:
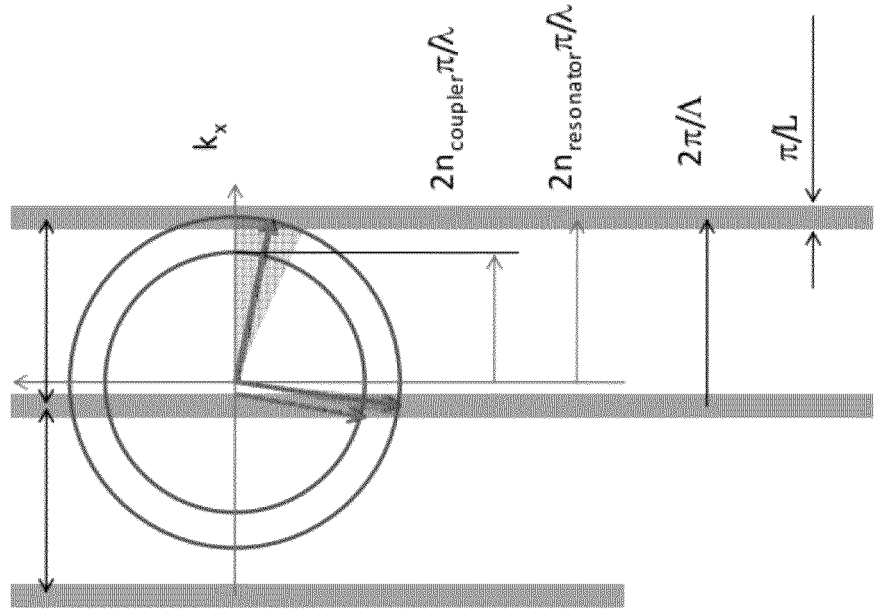

FIG. 8 shows a fiber grating coupler with the grating section in the core. This design leads to a small aperture optical phase grating on the fiber end facet and can be used in certain devices. FIGS. 9 and 10 show operations of the two fiber grating couplers in FIGS. 7 and 8, respectively While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations, enhancements and other implementations can be made based on what is described and illustrated in this patent application.

What is claimed is:

1. An optical device, comprising:
an optical resonator structured to support a whispering gallery mode circulating in a plane of the optical resonator; and
a diffractive grating coupler comprising a substrate and a phase-type diffractive grating formed in the substrate, the diffractive grating coupler being located close to the optical resonator to evanescently couple an input optical beam incident at a normal incidence to one side of the substrate of the diffractive grating into the optical resonator located on the other side of the substrate of the diffractive grating,
wherein the diffractive grating is structured to suppress diffracted light along the normal incidence and diffract light of the input optical beam into a first diffraction order at a first side of the normal incidence that matches in phase with light in the whispering gallery mode along a first circulating direction and a second diffraction order at a second side of the normal incidence that matches in phase with light in the whispering gallery mode along a second circulating direction opposite to the first circulating direction to create a standing wave in the whispering gallery mode inside the optical resonator.

2. The device as in claim 1, wherein:
the optical resonator is a spheroidal resonator.

3. The device as in claim 1, comprising:
an optical beam shaping device placed in an optical path of the input optical beam to shape the input optical beam at the diffractive grating coupler to assist the phase matching of the first diffraction order and the second diffraction order with the light in the whispering gallery mode in the optical resonator.

4. The device as in claim 3, wherein:
the optical beam shaping device comprises a GRIN lens.

5. The device as in claim 3, wherein:
the optical beam shaping device comprises an optical mode expander.

6. The device as in claim 3, comprising:
a laser located near the optical beam shaping device to direct a laser beam as the optical input beam into the optical beam shaping device and to receive feedback light from the optical beam shaping device and the diffractive grating coupler that is received by the diffractive grating via evanescent light of light in the whispering gallery mode at the surface of the optical resonator, wherein the laser is locked to an optical frequency of the received feedback light.

7. The device as in claim 6, wherein:
the laser is a semiconductor diode laser.

8. The device as in claim 6, wherein:
the laser is a distributed feedback laser.

9. The device as in claim 6, comprising:
a second diffractive grating coupler comprising a second substrate and a second phase-type diffractive grating formed in the second substrate, the second diffractive grating coupler being located close to the optical resonator at a location different from the diffractive grating coupler and operable to evanescently couple light out of the optical resonator to produce an output optical beam; and
an optical detector that receives the output optical beam from the second diffractive grating coupler to convert the received output optical beam into an RF signal.

10. A method for providing optical coupling for a whispering gallery mode optical resonator, comprising:
placing a diffractive grating coupler close to an optical resonator which supports a whispering gallery mode circulating in a plane of the optical resonator to effectuate optical evanescent coupling therebetween, wherein the diffractive grating coupler comprises a substrate and a phase-type diffractive grating formed in the substrate and evanescently couples input light incident at a normal incidence to one side of the substrate of the diffractive grating into the optical resonator located on the other side of the substrate, and the diffractive grating is structured to suppress diffracted light along the normal incidence and diffract light of the input optical beam into a first diffraction order at a first side of the normal incidence that matches in phase with light in the whispering gallery mode along a first circulating direction and a second diffraction order at a second side of the normal incidence that matches in phase with light in the whispering gallery mode along a second circulating direction opposite to the first circulating direction; and
directing an input optical beam at an incident direction into the diffractive grating coupler to couple light into the optical resonator.

11. The method as in claim 10, wherein:
the incident direction is normal to the substrate of the diffractive grating coupler to diffract light of the input optical beam into the first diffraction order that matches in phase with light in the whispering gallery mode along the first circulating direction and the second diffraction order that matches in phase with light in the whispering gallery mode along the second circulating direction to create a standing wave in the whispering gallery mode inside the optical resonator.

12. The method as in claim 10, comprising:
using an optical fiber to guide the input optical beam into the diffractive grating coupler.

13. The method as in claim 12, wherein:
the optical fiber includes a fiber core that has a fiber core grating section.

14. The method as in claim 13, wherein:
the phase-type diffractive grating covers an area of an end facet of the optical fiber over the fiber core and a surrounding area of the end facet of the optical fiber over fiber cladding outside the fiber core.

15. The device as in claim 1, comprising:
an optical fiber placed in an optical path of the input optical beam to guide and direct the input optical beam to the diffractive grating coupler.

16. The device as in claim 15, wherein:
the optical fiber includes a fiber core that has a fiber core grating section.

17. The device as in claim 16, wherein:
the phase-type diffractive grating covers an area of an end facet of the optical fiber over the fiber core and a surrounding area of the end facet of the optical fiber over fiber cladding outside the fiber core.

* * * * *